United States Patent [19]
Kim

[11] Patent Number: 5,940,330
[45] Date of Patent: Aug. 17, 1999

[54] SYNCHRONOUS MEMORY DEVICE HAVING A PLURALITY OF CLOCK INPUT BUFFERS

[75] Inventor: Jung Pill Kim, Ichon-shi, Rep. of Korea

[73] Assignee: Hyundai Electronics Industries Co., Ltd., Kyoungki-do, Rep. of Korea

[21] Appl. No.: 09/080,411

[22] Filed: May 18, 1998

[30] Foreign Application Priority Data

May 19, 1997 [KR] Rep. of Korea ................ 97-19281

[51] Int. Cl.⁶ .................................................. G11C 7/00
[52] U.S. Cl. .................... 365/189.05; 365/194; 365/233
[58] Field of Search ........................... 365/189.05, 233, 365/230.08, 194

[56] References Cited

U.S. PATENT DOCUMENTS

| | | | |
|---|---|---|---|
| 5,659,507 | 8/1997 | Yabe et al. | 365/189.01 |
| 5,687,134 | 11/1997 | Sugawara et al. | 365/233 |
| 5,801,554 | 9/1998 | Momma et al. | 365/189.05 X |
| 5,815,462 | 9/1998 | Konishi et al. | 365/189.05 X |

*Primary Examiner*—Do Hyun Yoo
*Attorney, Agent, or Firm*—Thelen Reid & Priest LLP

[57] ABSTRACT

A synchronous memory device having a plurality of clock input buffers includes a first clock input buffer for generating an enable signal of a data output buffer, and a second clock input buffer for generating a signal to latch external input signals (i.e., an address signal, a row address strobe (RAS) signal, a column address strobe (CAS) signal and so on). As a result, the synchronous memory device achieves a clock access time of a high speed, and reduces a current consumption in a standby mode.

7 Claims, 7 Drawing Sheets

Fig. 8

SYNCHRONOUS MEMORY DEVICE HAVING A PLURALITY OF CLOCK INPUT BUFFERS

BACKGROUND OF THE INVENTION

1. Field of the Invention

The present invention relates to a synchronous momory device using a clock signal. More particularly, it relates to a synchronous memory device which has a plurality of clock input buffers in order to separately control a clock input buffer simultaneously controlling both a data output buffer and a latch circuit by using one command signal.

2. Description of the Prior Art

Figure 1:
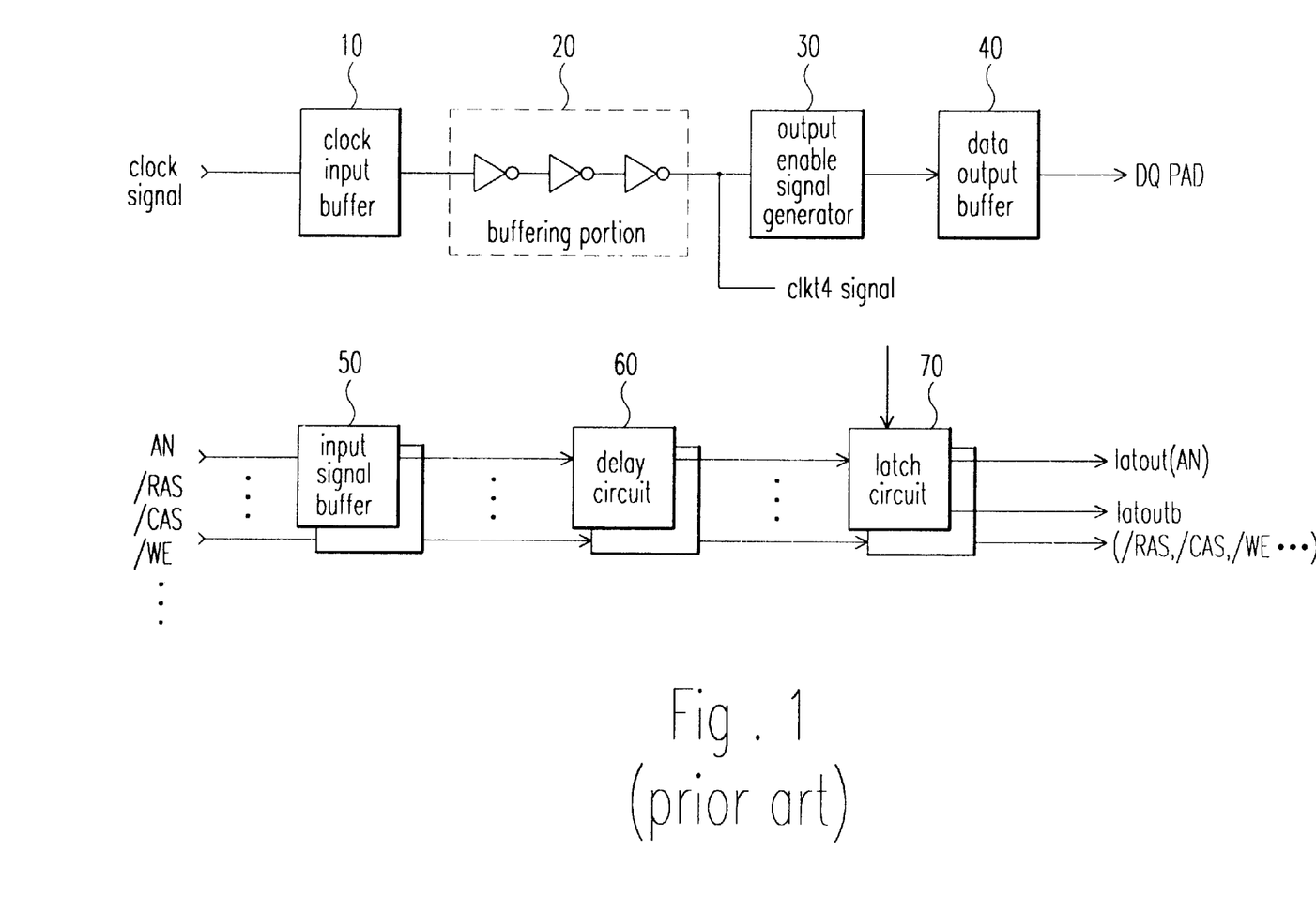
FIG. 1 is a block diagram of a conventional semiconductor memory device using a clock input buffer.

FIG. 1 depicts a block diagram of a conventional semiconductor memory device using a clock input buffer.

As shown in FIG. 1, the conventional memory device having a clock input buffer includes: a clock input buffer 10 for buffering an input clock signal; a buffering portion 20 for increasing a driving ability of an output signal of the clock input buffer 10; an output enable signal generator 30 which receives an output signal CLKT4 of the buffering portion 20, and generates an enable signal of a data output buffer 40; a data output buffer 40 which buffers a data and then generates the data to an output pad DQ PAD; an input signal buffer 50 which buffers predetermined input signals (i.e., AN, /RAS, /CAS, /WE, . . . ); a delay circuit 60 for delaying an output signal of the input signal buffer 50 during a predetermined time; and a latch circuit 70 for latching an output signal of the delay circuit 60 by the output signal CLKT4 of the buffering portion 20.

Operations of the semiconductor device will now be described below.

The signal CLKT4 generated from the clock input buffer 10 and the buffering portion 20 can control the data output buffer 40 and the latch circuit 70 at the same time. That is, the signal CLKT4 is input to the output enable signal generator 30. The output enable signal generator 30 enables the data output buffer 40, the data output pad DQ PAD outputs the data. Also, while the signal CLKT4 is applied to the output enable signal generator 30, the signal CLKT4 is applied to the latch circuit 70 and thus controls a stored latch signal.

Figure 2:
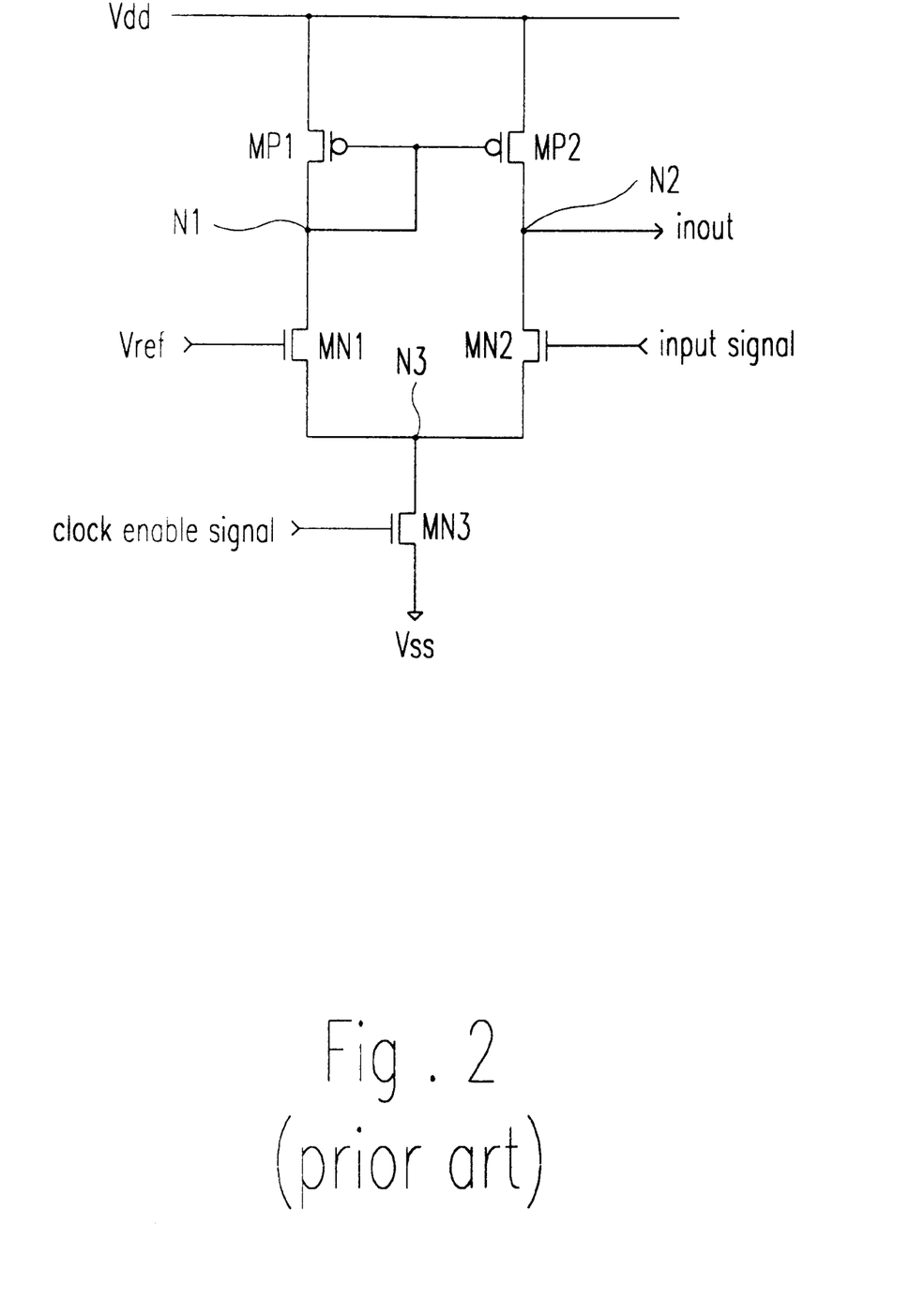
FIG. 2 depicts a detailed circuit diagram of a data input buffer shown in FIG. 1.

FIG. 2 depicts a differential amplifier used as a data input buffer shown in FIG. 1. Since the circuit shown in FIG. 2 is well known to those skilled in the art, its operation is omitted below.

Figure 3:
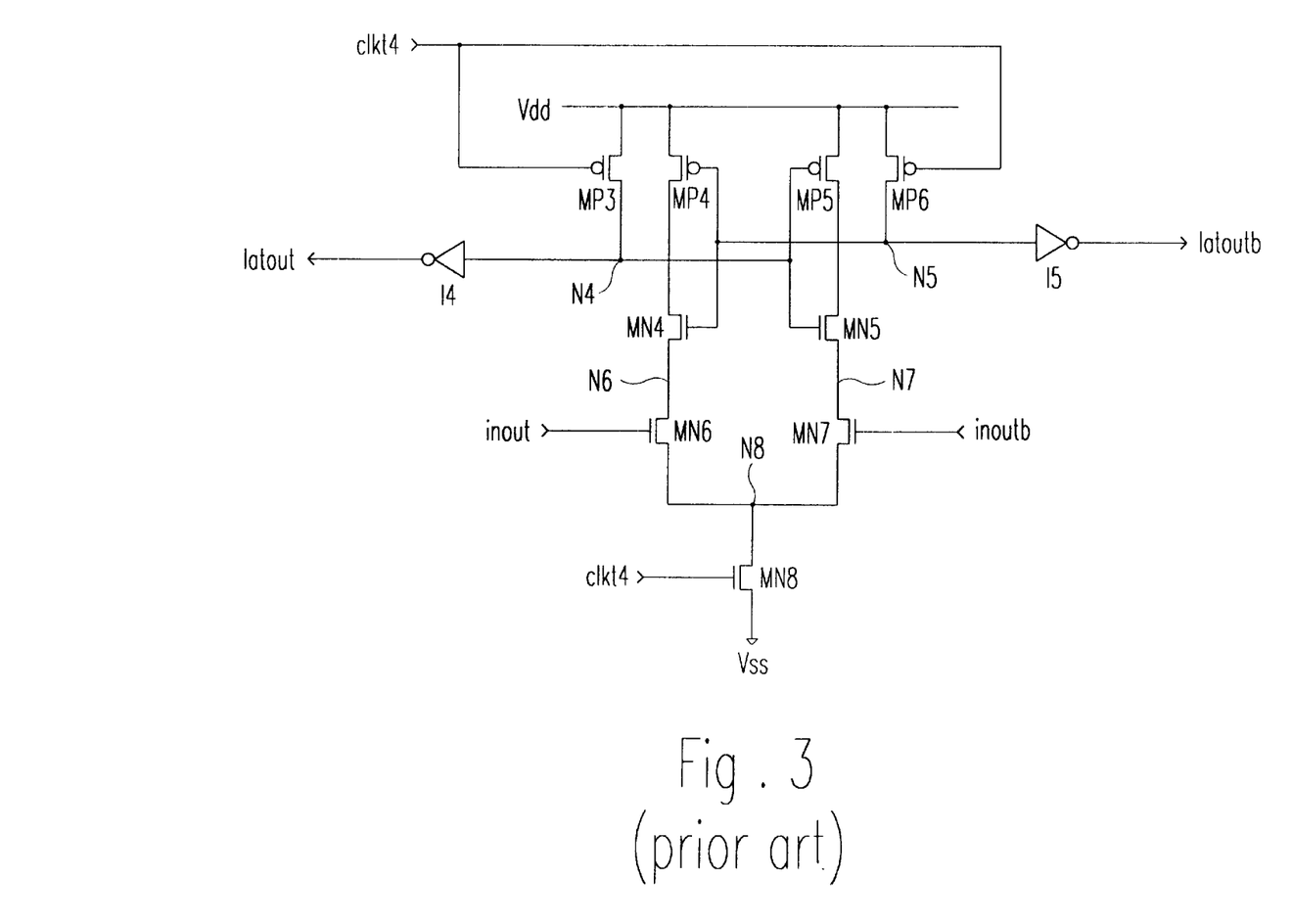
FIG. 3 depicts a detailed circuit diagram of a latch circuit shown in FIG. 1.

FIG. 3 depicts an example of the latch circuit shown in FIG. 1.

As shown in FIG. 3, if the control signal CLKT4 is activated as a high level, the control signal CLKT4 latches a value of an input signal before an electric potential of the input signal is changed.

If an input signal INOUT is at a high level, an input signal INOUTB is to be a low level. Accordingly, n-channel metal oxide semiconductor (hereinafter referred to as NMOS) transistor MN6 is turned on greater than NMOS transistor MN7. As a result, a NMOS transistor MN4 and a p-channel metal oxide semiconductor (hereinafter referred to as PMOS) transistor MP5 are turned on, so that an output terminal LATOUT outputs a high signal and an output terminal LATOUTB outputs a low signal. In addition, PMOS transistors MP3 and MP6 controlled by the control signal CLKT4 maintain signals applied to the output terminals.

As described above, in the conventional semiconductor memory device having a clock input buffer, the control signal CLKT4 is applied to the latch circuit 70 simultaneously with being applied to the data output buffer 40. Accordingly, a current driving size of the buffering portion 20 for driving the control signal CLKT4 should be increased, and the size of the clock input buffer 10 should be also increased. In particular, controlling the data output buffer 40 is an important path to determine a clock access time which is the most important element in a SDRAM field. If there are much current consumption in the clock input buffer 10, the access time becomes increased.

SUMMARY OF THE INVENTION

Accordingly, the present invention is directed to a synchronous memory device having a plurality of clock input buffers that substantially obviates one or more of the problems due to limitations and disadvantages of the related art.

It is an objective of the present invention to provide a semiconductor memory device having a plurality of clock input buffers which includes a plurality of clock input buffers in order to achieve a clock access time of a high speed.

It is another objective of the present invention to provide a semiconductor memory device having a plurality of clock input buffers which operates a data output buffer during only a read operation by additionally having a clock input buffer for a data output operation, and reduces a current consumption during a standby mode.

To achieve the above objectives, a synchronous memory device having a plurality of clock input buffers in accordance with the present invention includes:

a first clock input buffer 10 for generating an enable signal of a data output buffer; and a second clock input buffer 90 for generating a signal to latch external input signals such as an address signal, a row address strobe (hereinafter referred to as a RAS) signal, a column address strobe (hereinafter referred to as a CAS) signal and so on.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
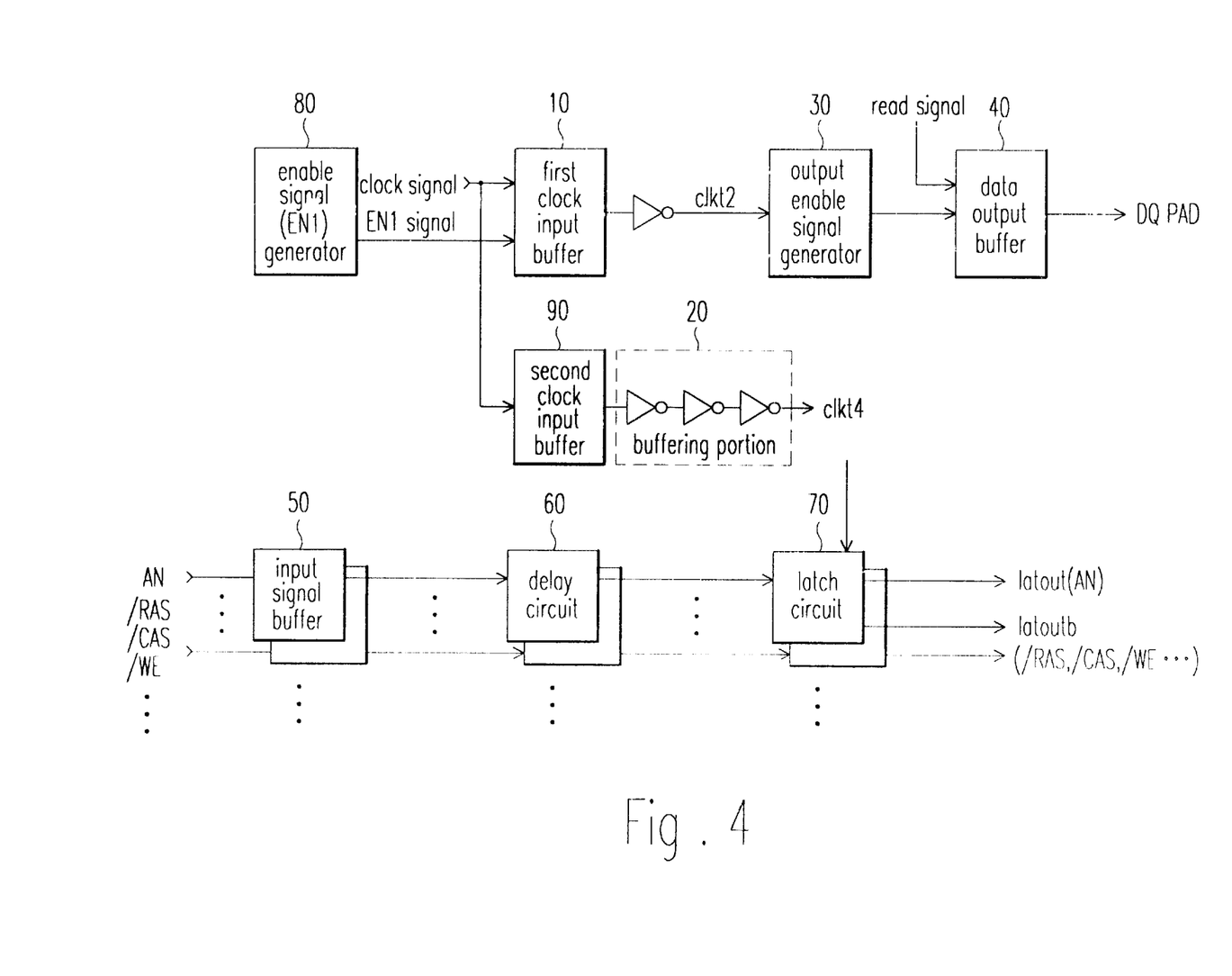
FIG. 4 depicts a block diagram of a semiconductor memory device having a plurality of clock input buffers in accordance with a first preferred embodiment of the present invention.

FIG. 4 depicts a block diagram of a semiconductor memory device in accordance with a first preferred embodiment of the present invention.

As shown in FIG. 4, the semiconductor memory device includes:

a first clock input buffer 10 which buffers a clock signal in order to output data to an output pad DQ PAD;

an output enable signal generator 30 which receives an inverting signal CLKT2 of an output signal of the first clock input buffer 10 as an input, and generates an output enable signal;

a data output buffer 40 which receives an output signal of the output enable signal generator 30 and a read signal as an input;

an input signal buffer 50 which buffers an input signal in order to latch external input signals such as an address signal, a row address strobe (hereinafter referred to as a RAS) signal, a column address strobe (hereinafter referred to as a CAS) signal and so on;

a delay circuit 60 for delaying an output signal of the input signal buffer 50 for a predetermined time;

a second clock input buffer 90 for buffering the clock signal;

a buffering portion 20 having a plurality of inverters; and a latch circuit 70 which latches an output signal of the delay circuit 60 by using an output signal CLKT4 as an enable signal.

The aforementioned semiconductor memory device separately uses the first clock input buffer 10 and the second clock input buffer 90 in order to output data and external input signal. Accordingly, since the first clock input buffer 10 has a higher driving ability, a clock access time in an operation path of the data output buffer 40 becomes reduced. Also, if the first clock input buffer 10 is enabled during only read operation, a current consumption during a standby mode can be reduced. Further, in order to reduce the clock access time, it is desirable that the first clock input buffer 10 should be designed to have a lower load than that of the second clock input buffer 90.

Figure 5:
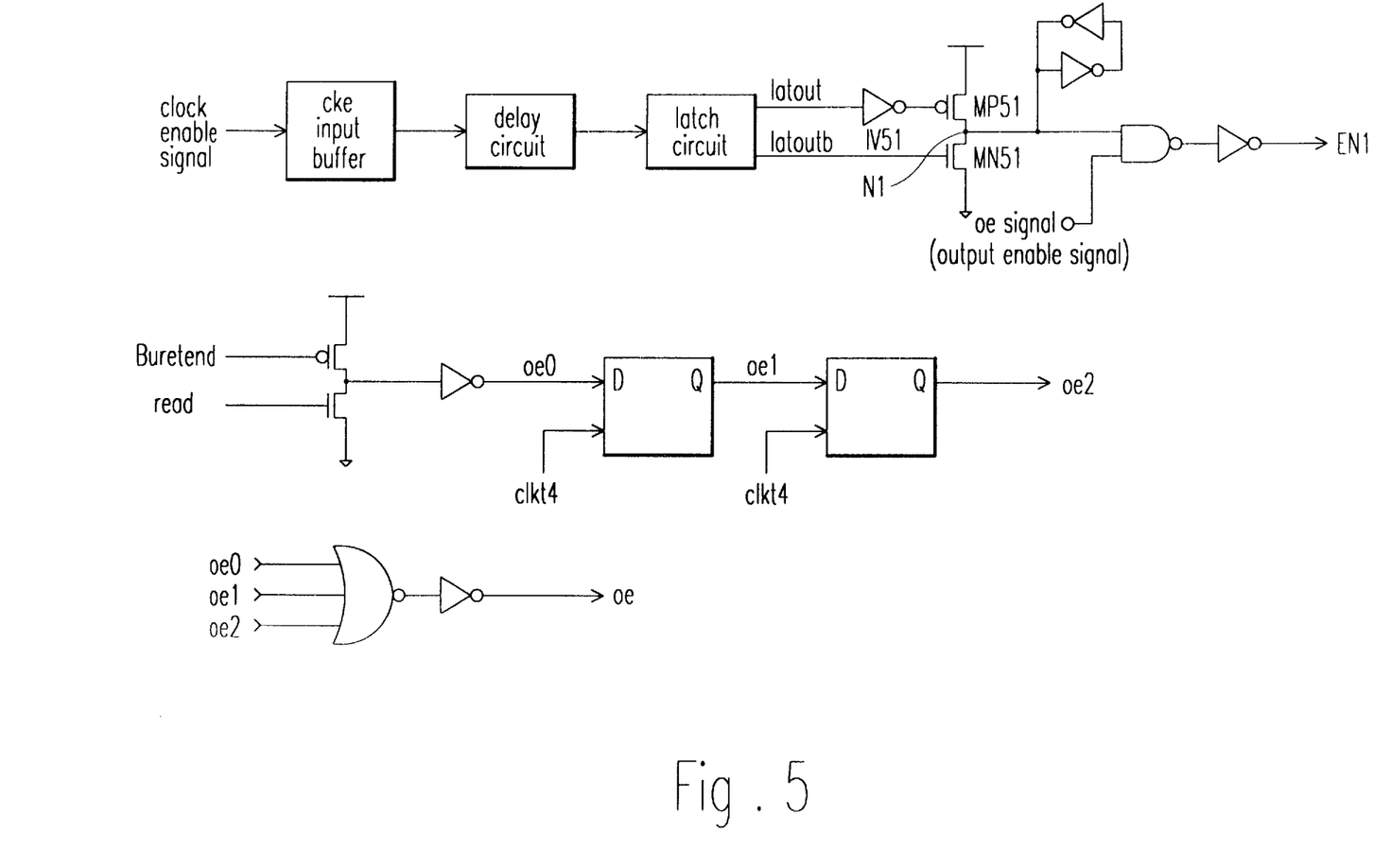
FIG. 5 depicts a circuit diagram illustrating a first preferred embodiment of an enable signal generator shown in FIG. 4.
Figure 6:
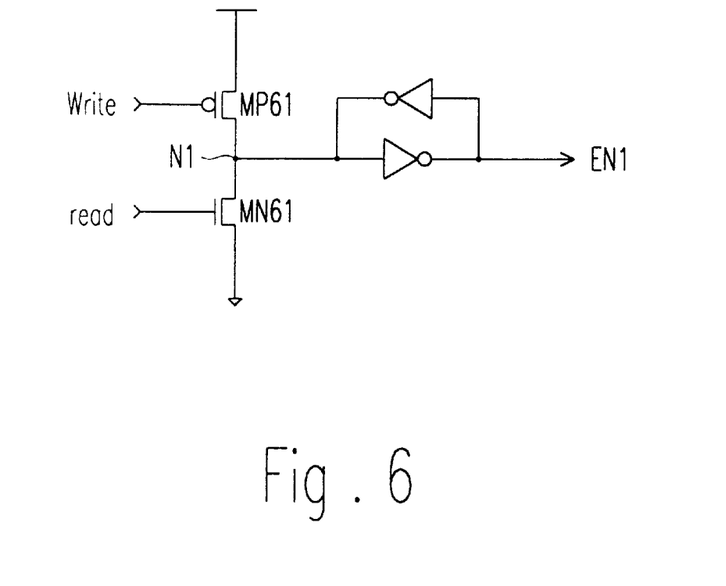
FIG. 6 depicts a circuit diagram illustrating a second preferred embodiment of an enable signal generator shown in FIG. 4.
Figure 7:
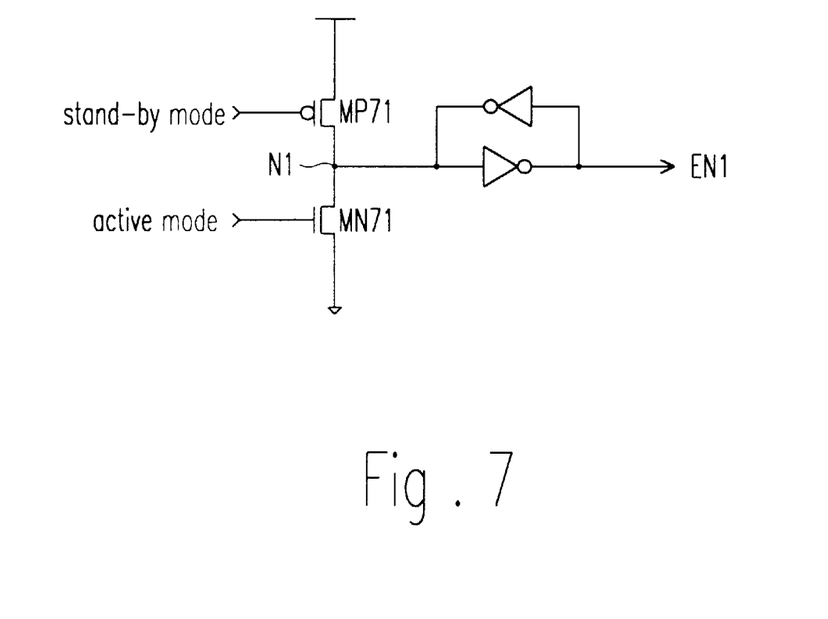
FIG. 7 depicts a circuit diagram illustrating a third preferred embodiment of an enable signal generator shown in FIG. 4.

FIGS. 5, 6 and 7 depict the preferred embodiments of an enable signal generator 80.

The enable signal generator shown in FIG. 5 controls the first clock input buffer 10 shown in FIG. 4. The enable signal generator turns on the first clock input buffer 10 only while the data is generated from the data output buffer 40, thereby lowering a current consumption during a standby mode.

As shown in FIG. 5, the enable signal generator includes:

a clock input buffer operated by a clock enable signal;

a dealy circuit which delays an output signal of the clock input buffer for a predetermined time, and increases a driving ability;

a latch circuit for latching an output signal of the delay circuit;

an inverter IV51 and a PMOS transistor MP51 which are connected to an output signal LATOUT of the latch circuit;

a NMOS transistor MN51 of which gate terminal is connected to another output signal LATOUTB of the latch circuit, a drain terminal is connected to the PMOS transistor MP51 via a node N1;

a signal amplifier for amplifying an output signal of the node N1; and an AND gate which receives both an output signal of the signal amplifier and an output enable signal OE operated during a read time as an input, and performs an AND logic operation about the output signal of the signal amplifier and the output enable signal OE. The AND gate is comprised of a NAND gate and inverters.

In operation, if the clock enable signal is enabled as a high signal, the clock enable signal is combined with the output enable signal OE to inform a data read section, so that the data output buffer is operated for only a data output section.

If a NOR logic operation is performed about signals OE0, OE1 and OE2, the output enable signal OE is made. As shown in FIG. 5, if a burst end signal BURSTEND meaning an end timing of a burst operation is enabled, the signal OE0 is at a low state. And, the signal OE0 is at a high state during a read operation mode. The signal OE0 is input to a D flip-flop, and an output signal of the D flip-flop is a signal OE1. The signal OE1 is input to another D flip-flop, and an output signal of the D flip-flop is a signal OE2. Accordingly, the two D flip-flops are enabled by the signal CLKT4.

FIG. 6 depicts a circuit diagram illustrating a second preferred embodiment of an enable signal generator of the first clock input buffer shown in FIG. 4.

As shown in FIG. 6, the enable signal generator includes: a PMOS transistor MP61 of which gate terminal receives a write command; a NMOS transistor MN61 of which gate terminal receives a read command; and a latch which is connected between a node N1 and an enable signal output terminal.

The enable signal (EN1) generator of the first clock input buffer is turned on during an entire read section. Namely, the enable signal generator is enabled by the read command, and is then reset by the write command.

FIG. 7 depicts a circuit diagram illustrating a third preferred embodiment of an enable signal generator shown in FIG. 4. As shown in FIG. 7, the enable signal generator includes: a PMOS transistor MP71 which receives a signal informing a standby mode through a gate terminal; a NMOS transistor MN71 which receives a signal informing an active mode through a gate terminal; and a latch which is connected between a node N1 and an enable signal output terminal.

Although the above enable signal (EN1) generator of the first clock input buffer is turned on during an entire read/write section, the enable signal EN1 is generated if a memory chip is activated, and then is turned off if a mode is changed to a standby mode.

Figure 8:
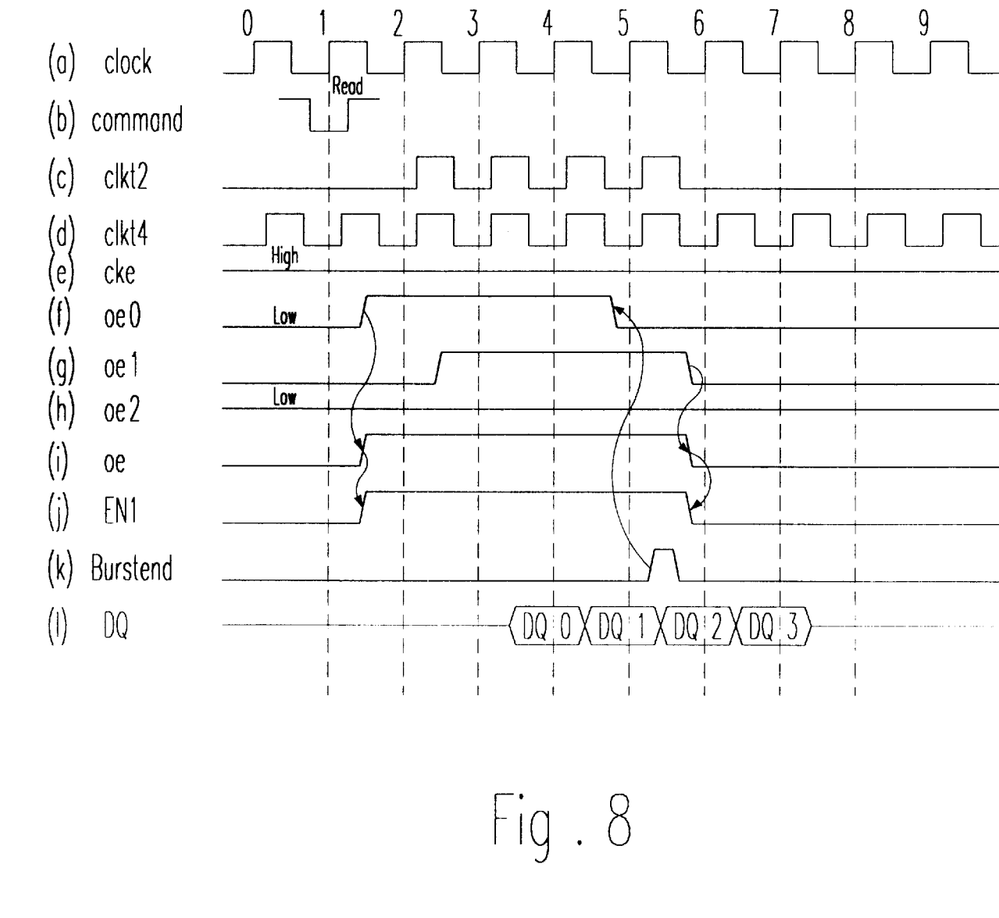
FIG. 8 depicts a timing diagram for all signals in the semiconductor memory device shown in FIG. 4.

FIG. 8 depicts a timing diagram for the semiconductor memory device shown in FIG. 4.

A clock enable signal CKE (e) is an external input signal, and applies a clock signal to the inside of the device only while the clock enable signal CKE (e) is at a high level.

A signal CLKT4 (d) is a delay signal of the clock signal. A signal CLKT2 (c) is operated during only the clocks 2–5 wherein an output enable signal OE is operated. A signal OE (i) is generated during a rising section of the signal OE0, and is ended by a falling section of the signal OE1, because the signal OE is an output signal of a NOR logic operation about the signals OE0, OE1 and OE2.

As shown in FIG. 8, the signal CLKT2 used for enabling the data output buffer is operated only during a section wherein a read signal is generated, thereby lowering a current consumption in a standby mode.

As described above, a semiconductor memory device having a plurality of clock input buffers in accordance with the present invention includes a plurality of clock input buffers in order to achieve a clock access time of a high speed. In addition, the semiconductor memory device having a plurality of clock input buffers in accordance with the present invention operates a data output buffer during only a read operation by additionally having a clock input buffer for a data output operation, and thus reduces a current consumption during a standby mode.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. In a semiconductor memory device having a plurality of input signal buffers for receiving external input signals, plural latch circuits for latching output signals from the input signal buffers, and a data output buffer for outputting data, an arrangement comprising:

a) a first clock input buffer for receiving a clock signal and for generating a signal for controlling operation of the data output buffer;

b) an enable signal generator for controlling operation of the first clock input buffer, wherein the first clock input buffer is enabled to be operated during a data read operation by control of the enable signal generator; and c) a second clock input buffer for receiving the clock signal and for controlling operation of the latch circuits.

2. The arrangement of claim 1, wherein the external input signals include:

an address signal;

a row address strobe signal; and a column address strobe signal.

3. The arrangement of claim 1 wherein:

the first clock input buffer is operated in a residual operation mode section excepting a standby mode section.

4. The arrangement of claim 1, wherein:

the first clock input buffer is operated during an entire read section.

5. The arrangement of claim 1, wherein:

the data output buffer is operated only while there is a data output in a section of a read signal.

6. The arrangement of claim 1, further comprising:

a delay circuit, positioned between the second clock input buffer and the plural latch circuits, to enhance a driving ability.

7. The arrangement of claim 1, wherein:

the first clock input buffer has a lower load than the second clock input buffer.

* * * * *